(12) United States Patent
Kim et al.

(10) Patent No.: US 7,332,933 B2
(45) Date of Patent: Feb. 19, 2008

(54) CIRCUIT FOR COMPENSATING FOR THE DECLINATION OF BALANCED IMPEDANCE ELEMENTS AND A FREQUENCY MIXER

(75) Inventors: Young-Jin Kim, Yongin (KR); Kyung-Suc Nah, Seoul (KR); In-Chul Hwang, Seoul (KR); Young-Suk Son, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/496,145

(22) Filed: Jul. 31, 2006

(65) Prior Publication Data

US 2006/0261845 A1 Nov. 23, 2006

Related U.S. Application Data

(62) Division of application No. 10/858,240, filed on Jun. 1, 2004, now Pat. No. 7,106,095.

(30) Foreign Application Priority Data

May 29, 2003 (KR) ................................ 2003-34225

(51) Int. Cl.
*H03K 17/16* (2006.01)
*H03K 19/003* (2006.01)

(52) U.S. Cl. ........................... 326/30; 326/32; 326/33; 326/86

(58) Field of Classification Search ............ 326/30–34, 326/86–87; 327/107–112
See application file for complete search history.

(56) References Cited

U.S. PATENT DOCUMENTS 6,734,702 B1 * 5/2004 Ikeoku et al. ................. 326/30

* cited by examiner

*Primary Examiner*—Anh Q. Tran
(74) *Attorney, Agent, or Firm*—F. Chau & Assoc., LLC

(57) ABSTRACT

Provided is a circuit for compensating for the declination of balanced impedance elements and a frequency mixer. The compensation circuit compensates for a difference between impedance measured at first and second impedance elements, and comprises first and second impedance circuits. The first impedance circuit transforms a first impedance value into a fine impedance value having $2^n$ steps in response to n lower bits of a control signal having k bits. The second impedance circuit transforms a second impedance value into a coarse impedance value having $2^m$ steps in response to m upper bits of the control signal. The first and second impedance values are measured at the first and second impedance elements, respectively, and k is equal to m plus n. The impedance difference between the impedance elements is linearly regulated.

7 Claims, 8 Drawing Sheets

US 7,332,933 B2

CIRCUIT FOR COMPENSATING FOR THE DECLINATION OF BALANCED IMPEDANCE ELEMENTS AND A FREQUENCY MIXER

CROSS-REFERENCE TO RELATED APPLICATION

The application is a divisional application of U.S. patent application Ser. No. 10/858,240, filed on Jun. 1, 2004, now U.S. Pat. No. 7,106,095 which claims priority to Korean Patent Application No. 2003-34225, filed on May 29, 2003.

BACKGROUND OF THE INVENTION

1. Technical Field

The present invention relates to a circuit for compensating for the declination of balanced impedance elements and a frequency mixer, and more particularly to a circuit for reducing secondary-order inter modulation distortion (IMD2) in a direct conversion receiver (DCR).

2. Discussion of the Related Art

Recently, various communication circuits have been integrated into a single semiconductor chip using a system-on-a-chip (SOC) design. For example, a typical radio frequency (RF) transmitter and receiver circuit used by a mobile communications device has been integrated into a single integrated circuit (IC) using a SOC design.

Balanced impedance elements are commonly used in SOC designs. Each of the impedance values of the balanced impedance elements may typically deviate from the designed (or desired) impedance values and have a variation (or declination) from one another due to certain technical limits resulting from the manufacture of the semiconductor device. Such technical limits or constraints that occur during manufacturing are, for example, mismatch of the area of the impedance elements and mismatch of the concentration of impurities. In a typical RF receiver circuit, the impedance variation of the balanced impedance elements may distort signals and deteriorate communication qualities.

FIG. 1 is a block diagram showing a conventional DCR. Referring to FIG. 1, the DCR converts an input RF signal into a baseband signal having an in-phase (I) component and a quadrature (Q) component instead of an intermediate frequency (IF) signal. An RF signal received from an antenna 10 is input to a low noise amplifier (LNA) 12 and is applied to mixers 14 and 16.

The mixer 14 mixes the RF signal output from the LNA 12 with a first local oscillating signal, such as $\cos(\omega t)$. The local oscillating signal is generated from a local oscillator (LO) 20 and has the same frequency as a carrier frequency (fc) of the RF signal. The mixer 16 mixes the RF signal output from the LNA 12 with a second local oscillating signal, for example $\sin(\omega t)$, having a phase difference of more than $\pi/2$ with respect to the first oscillating signal.

The mixers 14 and 16 generate a baseband signal that has a carrier frequency of 2*fc and an I component and Q component. Subsequently, some of the harmonics in the baseband signal are removed by low pass filters 22 and 24, and the baseband signal is then amplified by amplifiers 26 and 28.

The DCR of FIG. 1 has a basic circuit structure that occupies a small surface area on an IC and thus may easily be integrated into a SOC design. Because the DCR occupies such a small area, it may be manufactured at a low price. However, the DCR has certain disadvantages. For example, the mixers 14 and 16 generate a IMD2 because the mixers 14 and 16 are non-linear devices. Thus, the mixers 14 and 16 cause a direct current (DC) offset and generate not only a desired frequency signal but also a second order harmonic signal.

In particular, when signals having two frequencies f1 and f2 are input to a general non-linear circuit, signals having 2*f1, 2*f2, f1+f2, 3f1, 3f2, 2*f1−f2, 2f2−f1, 2f1+f2 or 2f2+f1, ... frequencies are generated from, for example, the mixers 14 and 16 due to the non-linear properties of the mixers 14 and 16.

Normally, the undesired frequencies resulting from the non-linear properties of the mixers 14 and 16 are removed by means of, for example, the low pass filters 22 and 24. However, when the input frequencies f1 and f2 are almost equal and the desired frequency signal is the baseband signal, the frequencies of f1 and f2 may be in the range of the baseband frequencies and may not be removed by the filters 22 and 24. These unfiltered signals may then cause interferences between channels having small frequency differences from adjacent channels and signal distortions due to the interferences between the unfiltered signals themselves.

The f1 and f2 frequency signal is referred to as the IMD2. The degree of the linearity of a circuit is represented by the relationship between the ratio of the IMD2 and the amplification of the signal input to the circuit. The degree of the linearity is referred to as $2^{nd}$ order intercept point (IP2). In addition, since the DCR shifts the desired signal to the baseband frequencies, the IMD2 generated from the mixers 14 and 16 may greatly deteriorate the performance of the DCR. Accordingly, the mixers 14 and 16 or a frequency mixer should have a high IP2 to reduce the ratio of the IMD2.

FIG. 2 is a circuit diagram showing a conventional Gilbert cell mixer. Referring to FIG. 2, the Gilbert cell mixer includes an emitter coupled pair of transistors Q1 and Q2 to which RF signals (RF$^+$, RF$^-$) are input, regeneration resistors RE1 and RE2, Gilbert cell core transistors Q3, Q4, Q5 and Q6, pull-up resistors R1 and R2, and differential output nodes NO1 and NO2.

In the Gilbert cell mixer, when second order harmonic signals (each of which is the same) are generated at each of the differential output nodes NO1 and NO2, the second order harmonic signals may be cancelled by each other and rejected by a common mode rejection property. However, when the second order harmonic signals have a phase and amplitude different from each other, the second order harmonic signals may not be cancelled due to a mismatch in their phases and amplitudes.

The mismatch may occur at the transistors Q1 and Q2, the resistors RE1 and RE2 and result from the duty ratio of the local oscillating signals and the RF signal. The mismatch at certain elements (resistors, transistors, etc.), is caused by the size difference between the elements and a difference in the concentration of impurities.

A feedback circuit for compensating for the non-linearity of the Gilbert cell mixer is disclosed in U.S. Patent Application Publication No. 2002-193089A1, and a system for reducing intermodulation distortion in a DCR is disclosed in PCT Laid Open Patent Publication No. WO 02/80384 A1. According to the disclosure in the U.S. Patent Application Publication No. 2002-193089A1, a bias voltage of the transistor in the Gilbert cell core is regulated in response to the voltage difference between the differential output nodes, so that the mismatch of the area of the transistor is compensated. In the PCT Laid Open Patent Publication No. WO 02/80384 A1, a frequency mixer detects an intermodulation signal included in an RF signal input to the frequency mixer, and applies a compensation signal to an output signal of the frequency mixer, so that intermodulation distortion in the output signal may be reduced.

Thus, there is a need for a circuit that reduces IMD2 and DC offset in DCRs.

SUMMARY OF THE INVENTION

In one embodiment of the present invention, a compensation circuit for compensating for a difference between impedance measured from first and second impedance elements comprises a first impedance circuit and a second impedance circuit. The first impedance circuit transforms a first impedance value into a fine impedance value having $2^n$ steps in response to n lower bits of a control signal having k bits. The first impedance value is measured at the first impedance element, and k is equal to m plus n. The second impedance circuit transforms a second impedance value into a coarse impedance value having $2^m$ steps in response to m upper bits of the control signal. The second impedance value is measured at the second impedance element.

The first and second impedance elements may be a pair of balanced impedance elements wherein each of which provides two nodes of the circuit that has a symmetric structure with the same impedance in a balanced condition. For example, the first and second impedance elements comprise resistive elements or capacitive elements. When the first and second impedance elements are resistive elements, the first and second impedance circuits respectively may be coupled in parallel to one of the first and second resistive elements.

In accordance with an embodiment of the present invention where the first and second impedance elements are resistive elements, the first resistor comprises n resistors and n first switching elements. The n resistors may be coupled with one another in parallel, the n resistors have a $2^{(k-p)}$ (n−m≦p≦n) different resistance, and p is a positive integer. The n first switching elements may be respectively serially coupled with one of the n resistors, and each of said n first switching elements is switched in response to a corresponding bit of said n lower bits of the control signal.

The second resistor comprises m resistors, m second switching elements and a dummy resistor. The m resistors may be coupled with one another in parallel, the m resistors have a $2^{(k-q)}$ (n+1≦q≦m+n) different resistance, and q is zero or the positive integer. The m second switching elements may be respectively serially coupled with one of the m resistors, and each of said m second switching elements is switched in response to a corresponding bit of said m upper bits of the control signal. The dummy resistor may be coupled with said m resistors in parallel, and the dummy resistor has a resistance substantially the same as an equivalent resistance of said n resistors coupled in parallel with one another.

The first and second resistors further comprise a third switching element switched in response to the sign bit so that the first resistor is coupled in parallel with the second resistive element and the second resistor is coupled in parallel with the first resistive element.

The difference detection section comprises first and second measuring sections, a difference obtaining section and a look-up table. The first and second measuring sections measure the resistance of the first and second resistive elements, respectively, and the difference obtaining section obtains a difference value between the measured resistance of the first and second resistive elements. The look-up table outputs the control signal in response to the difference value.

When the first and second impedance elements are capacitive elements, the first and second impedance circuits respectively may be coupled in parallel to one of the first and second capacitive elements.

In accordance with an embodiment of the present invention where the first and second impedance elements are capacitive elements, the first capacitor comprises n capacitors and n first switching elements. The n capacitors may be coupled with one another in series, the n capacitors have a $2^{(k-p)}$ (n−m≦p≦n) different capacitance, and p is the positive integer. The n first switching elements may be respectively in parallel coupled with one of the n capacitors, and each of said n first switching elements is switched in response to a corresponding bit of said n lower bits of the control signal.

The second capacitor comprises m capacitors, m second switching elements and a dummy capacitor. The m capacitors may be coupled with one another in series, the m capacitors have a $2^{(k-q)}$ (n+1≦q≦m+n) different capacitance, and q is zero or the positive integer. The m second switching elements may be respectively in serial coupled with one of the m capacitors, and each of said m second switching elements are switched in response to a corresponding bit of said m upper bits of the control signal. The dummy capacitor may be coupled with said m capacitors in parallel, and the dummy capacitor has a capacitance substantially the same as an equivalent capacitance of said n capacitors coupled in parallel with one another. Each of the first and second capacitors further comprise a third switching element being switched in response to the sign bit so that the first capacitor is coupled in serial with the second capacitive element and the second capacitor is coupled in serial with the first capacitive element.

According to the compensation circuit of the present invention, the impedance difference between the impedance elements vary substantially linearly based on a control code of the control signal. In a coarse compensation operation, the impedance difference varies according to $2^m$ steps in response to the control code. In a fine compensation operation, the impedance difference varies according to $2^n$ steps (m<n) in response to the control code. Therefore, the difference of the impedance measured at the first and second impedance elements varies linearly according to the control code.

In accordance with yet another embodiment of the present invention, a circuit for mixing frequencies comprises a mixer, first and second pull-up resistors and a difference compensation circuit. The mixer receives a first input signal having a first frequency and a second input signal having the first frequency, and the first input s signal has an inverted phase with respect to the second input signal. The mixer mixes a local oscillating signal having a second frequency with the first and second input signals to output first and second output signals to first and second output terminals, respectively. The first output signal has a third frequency corresponding to a first difference between the second and first frequency, and the second output signal has the third frequency. The first pull-up resistor pulls up the first output terminal, and the second pull-up resistor pulls up the second output terminal. The difference compensation circuit is coupled with the first and second pull-up resistors, and compensates for a second difference between the resistance measured from the first and second pull-up resistors in response to a control signal having (k+1) bits.

The difference compensation circuit comprises first and second resistors. The first resistor may be coupled in parallel to the first pull-up resistor, and transforms a first compound resistance value into a fine resistance value having $2^n$ steps in response to n lower bits of the k bits of the control signal. The first resistance value is measured at the first pull-up resistor, and k is equal to m plus n, wherein m and n are positive integers. The second resistor may be coupled in parallel to the second pull-up resistor, and transforms a second resistance value into a coarse resistance value having $2^m$ steps in response to m upper bits of k bits of the control signal. The second compound resistance value is measured at the second pull-up resistor.

The difference compensation circuit further comprises a difference detection section, and the difference detection section comprises a detection section, an analog-to-digital converter and a look-up table. The detection section detects a voltage difference between the first and second output terminals. The analog-to-digital converter generates a digital voltage difference corresponding to the detected voltage difference, and the look-up table outputs the control signal in response to the digital voltage difference.

In accordance with yet another embodiment of the present invention, a compensation circuit for compensating for a difference between impedance measured from first and second impedance elements, comprises: a first impedance circuit, coupled to a first impedance element, for transforming a first impedance value of the first impedance element into a fine impedance value in response to a control signal; a second impedance circuit, coupled to a second impedance element, for transforming a second impedance value of the second impedance element into a coarse impedance value in response to the control signal; and a difference detection circuit, coupled to the first and second impedance circuits, for measuring the impedance of the first and second impedance elements and for generating the control signal to compensate for a difference between the measured impedance.

BRIEF DESCRIPTION OF THE DRAWINGS

The aspects of the present invention will become more apparent by describing in detail exemplary embodiments thereof with reference to the accompanying drawings, in which.

DESCRIPTION OF EXEMPLARY EMBODIMENTS

Figure 1:
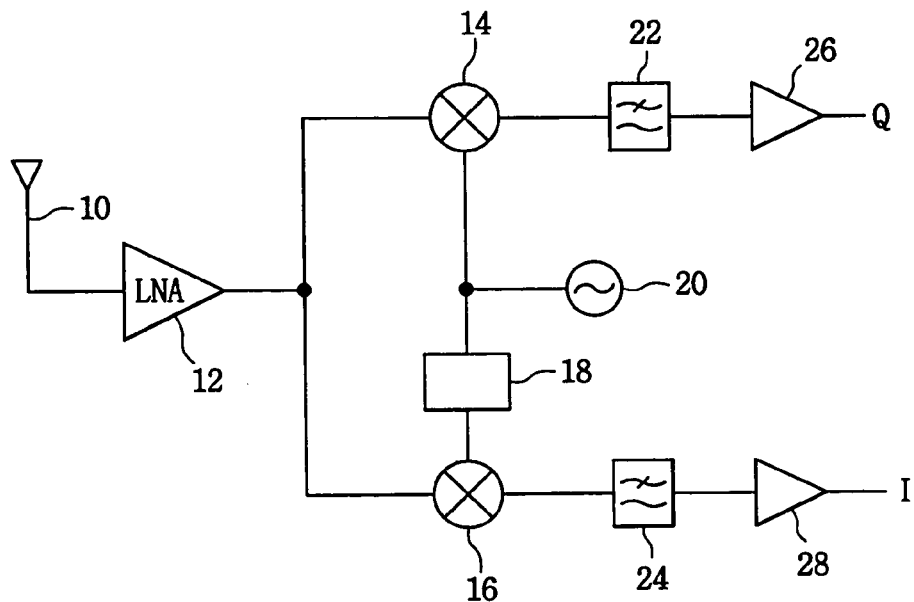
FIG. 1 is a block diagram showing a conventional direct conversion receiver (DCR)
Figure 2:
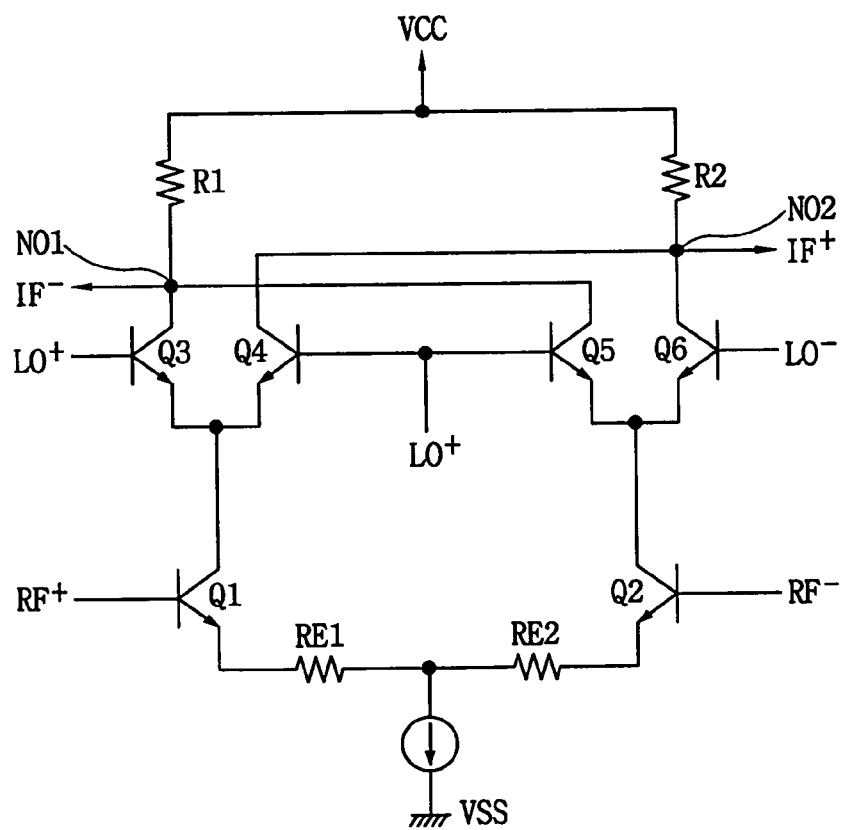
FIG. 2 is a circuit diagram showing a conventional Gilbert cell mixer.
Figure 3:
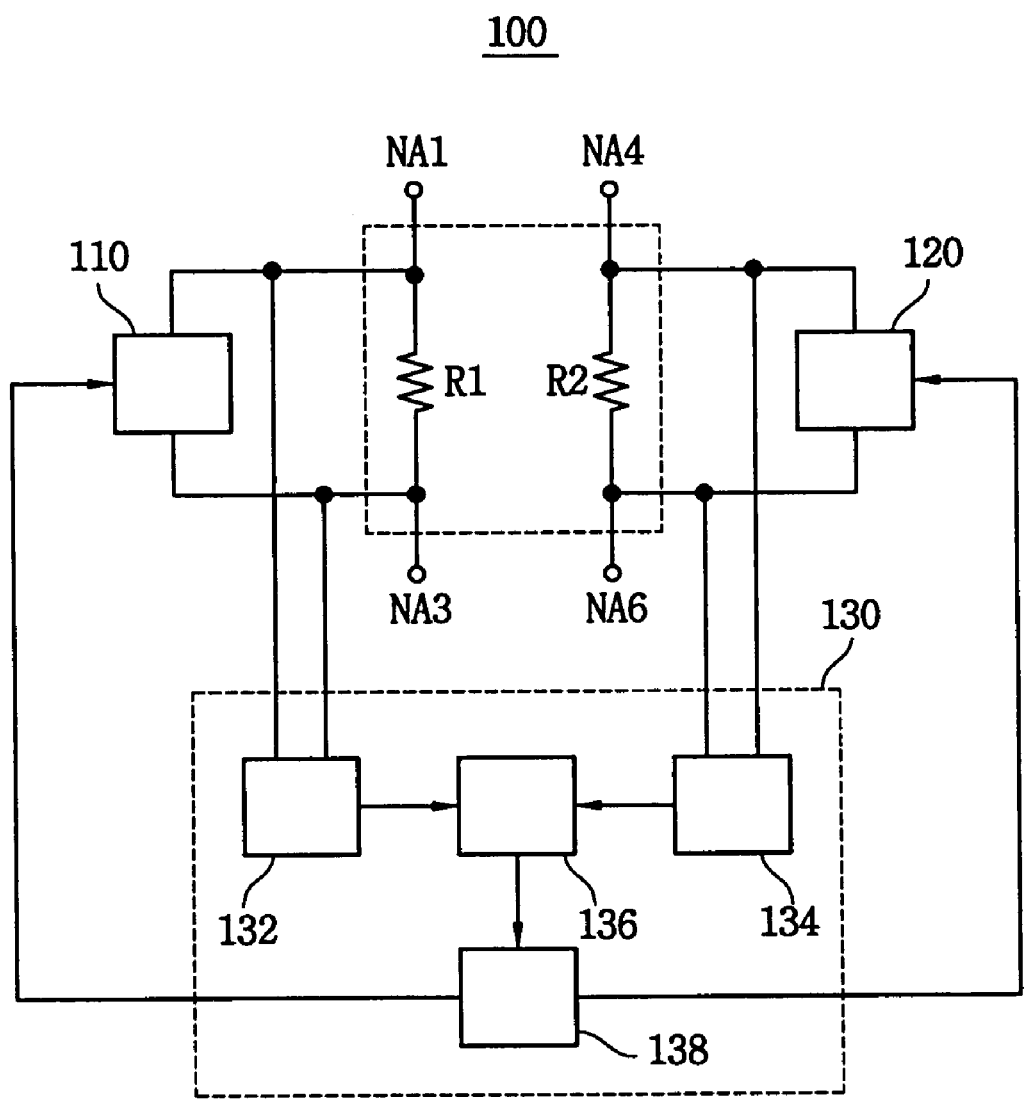
FIG. 3 is a block diagram showing a difference compensation circuit according to an exemplary embodiment of the present invention.
Figure 4:
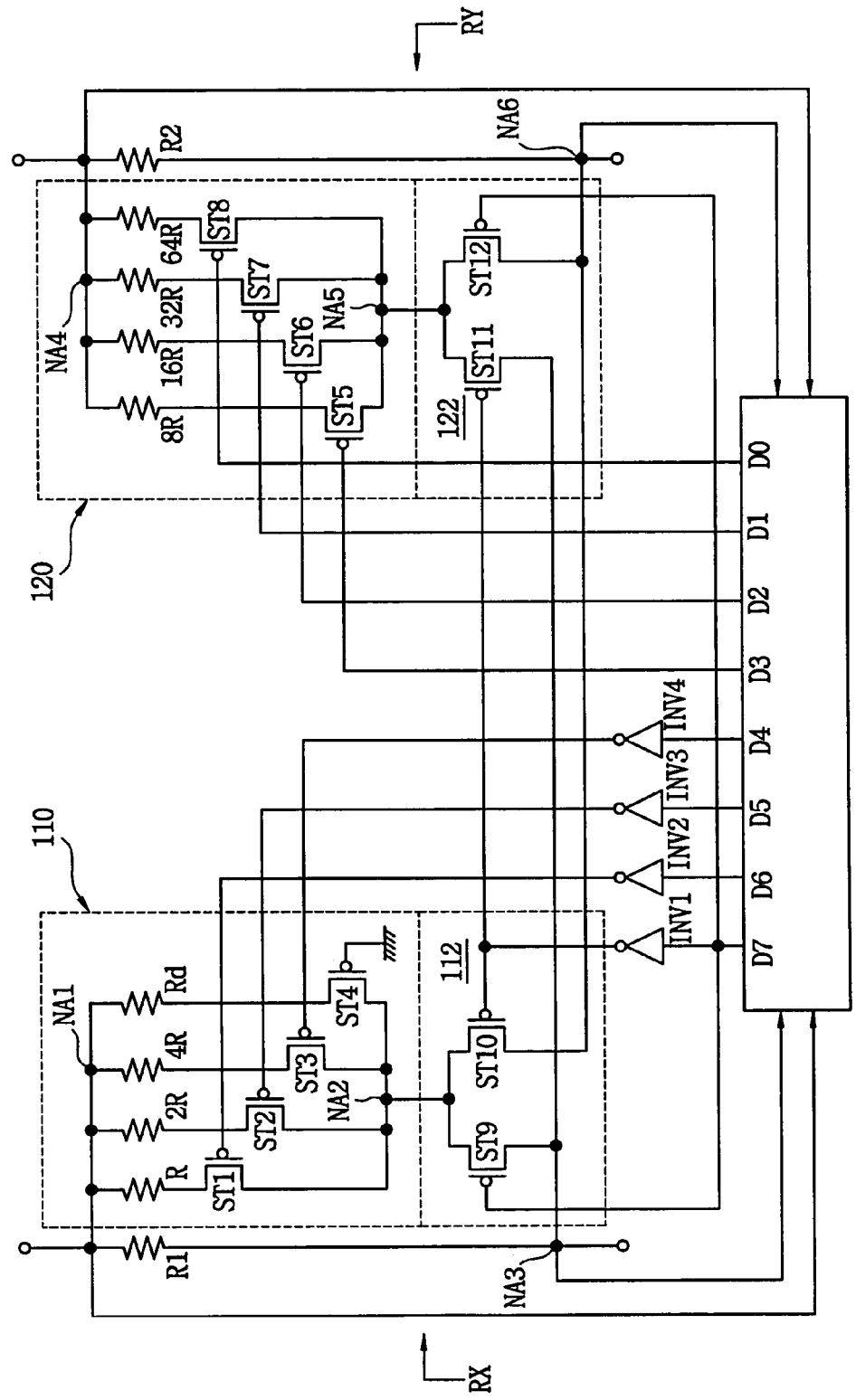
FIG. 4 is a circuit diagram showing digital variable impedance elements of FIG. 3.

FIG. 3 is a block diagram showing a difference compensation circuit 100 for compensating for the difference between impedance measured from balanced impedance elements according to an exemplary embodiment of the present invention. FIG. 4 is a circuit diagram showing digital variable impedance elements of FIG. 3. For exemplary purposes, the impedance measured from the balanced impedance elements of FIG. 3 and the digital variable impedance elements of FIG. 4, are hereinafter referred to and depicted as a resistance measured from balanced resistive elements and digital variable resistors, respectively. It is to be understood that the term "impedance" as used herein is known to a person of ordinary skill in the art to mean, a measure of the total opposition to current flow in an electric circuit, which is determined by a particular combination of resistance (measured across a resistor), capacitive reactance (measured across a capacitor) or inductive reactance (measured across an inductor) in a given circuit. Referring to FIGS. 3 and 4, the difference compensation circuit 100 includes a first digital variable resistor 110, a second digital variable resistor 120 and a difference detection section 130.

The first digital variable resistor 110 is connected in parallel to a resistor R1, the second digital variable resistor 120 is connected in parallel to a resistor R2. The difference detection section 130 is connected to the resistors R1 and R2, calculates the resistance difference between the resistors R1 and R2, and provides the first and second digital variable resistors 110 and 120 with an 8 bit control signal (D7, D6, . . . , D0) or (D0, D1, . . . , D7) for compensating for the calculated resistance difference. The uppermost bit D7 of the 8 bit control signal is a sign bit. The sign bit is positive or negative according to the bit value '1' or '0'. The upper 3 bits (D6, D5, D4) are provided to the first digital variable resistor 110, and the lower 4 bits (D3, D2, D1, D0) are provided to the second digital variable resistor 120. The upper 4 bits (D7, D6, D5, D4) are inverted by inverters INV1, INV2, INV3 and INV4 before the upper 4 bits (D7, D6, D5, D4) are output from the difference detection section 130.

The first digital variable resistor 110 includes four resistors R, 2R, 4R and Rd each of which is coupled in parallel to nodes NA1 and NA2. The resistor R has a unit resistance R, the resistance of the resistor 2R is two times as large as the unit resistance R, and the resistance of the resistor 4R is four times as large as the unit resistance R. The resistor Rd is a dummy resistor, and the resistance of the dummy resistor Rd is the same as an equivalent resistance of resistors 8R, 16R, 32R and 64R, which are coupled in parallel with one another in the second digital variable resistor 120.

A switching element ST1 is serially connected to the resistor R, a switching element ST2 is serially connected to the resistor 2R, a switching element ST3 is serially connected to the resistor 4R, and a switching element ST4 is serially connected to the resistor Rd. The switching element ST4 is maintained in a turn-on state. The switching elements ST1, ST2 and ST3 are turned on in response to inverted upper 3 bits $\overline{D6}$, $\overline{D5}$ and $\overline{D4}$, respectively. As shown in FIG. 4, when a positive-channel metal oxide semiconductor (PMOS) transistor is used as the switching elements (e.g., ST1-ST4), a control electrode of the switching element ST4 is connected to a low power source (VSS), for example, an earth potential.

The second digital variable resistor 120 includes the four resistors 8R, 16R, 32R and 64R each of which is coupled in parallel to nodes NA4 and NA5. The resistance of the resistor 8R is eight times as large as the unit resistance R, the resistance of the resistor 16R is sixteen times as large as the unit resistance R, and the resistance of the resistor 64R is sixty four times as large as the unit resistance R.

A switching element ST5 is serially connected to the resistor 8R, a switching element ST6 is serially connected to the resistor 16R, a switching element ST7 is serially connected to the resistor 32R, and a switching element ST8 is serially connected to the resistor 64R. The switching elements ST5, ST6, ST7 and ST8 are turned on in response to the lower 4 bits D3, D2, D1 and D0, respectively.

The output resistance of the first digital variable resistor 110 has 8 coarse levels (0, 1, . . . , 7) according to the value of the 3 inverted bits $\overline{D6}$, $\overline{D5}$ and $\overline{D4}$. The dummy resistor Rd determines a difference between each of the coarse 8 levels. The output resistance of the second digital variable resistor 120 has 16 fine levels (0, 1, . . . , 15) determined by the value of 4 the bits D3, D2, D1 and D0. The resistor 64R determines the difference between each of the fine 16 levels.

Therefore, a total equivalent resistance Rx (or Rt1 of FIG. 5) between the node NA1 and a node NA3 varies according to the coarse 8 levels. In the coarse 8 levels, the dummy resistor Rd is a unit resistance. A total equivalent resistance Ry (or Rt2 of FIG. 5) between the node NA4 and a node NA6 varies according to the fine 16 levels. In the fine 16 levels, the resistor 64R is a unit resistance.

For example, when the resistors R1 and R2 are respectively 1□, and the resistor R is 22.5□, the difference resistance in the coarse 8 levels varies by about 11□, and the difference resistance in the fine 16 levels varies by about 0.7□. Therefore, the total difference resistance ΔR varies linearly according to 127 levels. The total difference resistance ΔR is shown in expression 1.

$$\Delta R = Rx(\text{or } Rt1) - Ry(\text{or } Rt2) \quad (1)$$

The first digital variable resistor 110 also includes a first switching circuit 112, and the second digital variable resistor 120 includes a second switching circuit 122. In the first switching circuit 112, a switching element ST9 is connected between the nodes NA2 and NA3, and a switching element ST10 is connected between the nodes NA2 and NA6. The switching element ST9 is switched by the upper most bit D7, and the switching element ST10 is switched by the inverted upper most bit $\overline{D7}$. In the second switching circuit 122, a switching element ST11 is connected between the nodes NA5 and NA3, and a switching element ST12 is connected between the nodes NA5 and NA6. The switching element ST11 is switched by the inverted upper most bit $\overline{D7}$, and the switching element ST12 is switched by the upper most bit D7.

When the switching elements ST9, ST10, ST11 and ST12 are PMOS transistors and D7 has a logic value of '0', the switching elements ST9 and ST12 are turned on and the switching elements ST10 and ST11 are turned off. Accordingly, the first digital variable resistor 110 is connected to the node NA3 via the switching element ST9, and the second digital variable resistor 120 is connected to the node NA6 via the switching element ST12. When D7 has logic value of '1', the switching elements ST9 and ST12 are turned off and the switching elements ST10 and ST11 are turned on. Accordingly, the first digital variable resistor 110 is connected to the node NA6 via the switching element ST10, and the second digital variable resistor 120 is connected to the node NA3 via the switching element ST11.

According to the first and second switching circuits 112 and 122, the first digital variable resistor 110 is electrically connected in parallel to not only the resistor R1 but also the resistor R2, and the second digital variable resistor 122 is electrically connected in parallel to not only the resistor R2 but also the resistor R1.

Figure 5:
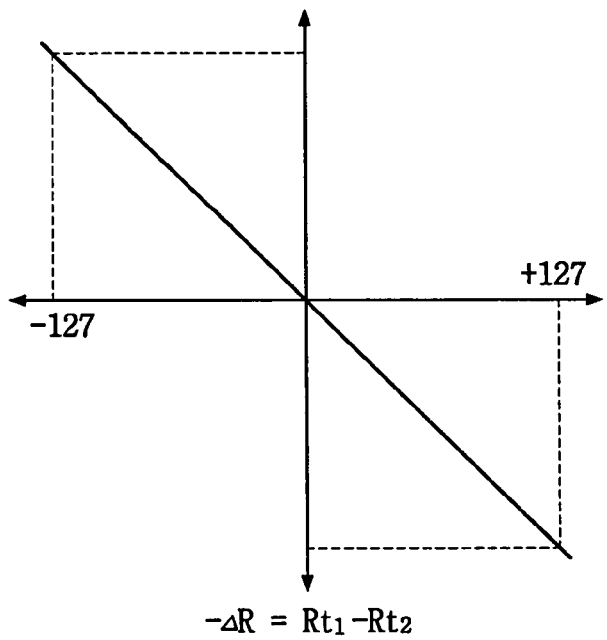
FIG. 5 is a graph showing a resistance variation according to a variation of a digital value of a control signal generated from the difference compensation circuit of FIG. 3.

As shown in FIG. 5, the total difference resistance ΔR is regulated to vary from a −127 level to +127 level according to the 8 bit control signal (D0, D1, . . . , D7). According to the first and second switching circuits 112 and 122, an 8 bit control signal instead of a 16 bit control signal is input to the first and second digital variable resistors 110 and 120. Therefore, a number of external terminals (in, for example, the difference compensation circuit 100) is reduced by ½. When the 16 bit control signal is input to each of the first and second digital variable resistors 110 and 120, the number of external terminals may increase by two.

As shown in FIG. 3, the difference detection section 130 includes first and second resistance measuring sections 132 and 134, a difference obtaining section 136 and a look-up table 138. The first resistance measuring section 132 measures the resistance of the resistor R1, and the second resistance measuring section 134 measures the resistance of the resistor R2. The first and second resistance measuring sections 132 and 134 are not electrically connected to the resistors R1 and R2 in a normal operation mode, but are electrically connected to the resistors R1 and R2 in a compensation operation mode. In addition, the first and second resistance measuring sections 132 and 134 have high input impedance to enable precise measurements of the resistance of the resistors R1 and R2.

The measured resistance is provided to the difference obtaining section 136. The difference obtaining section 136 obtains a difference value (e.g., a declination or variation) between the measured resistance of the resistor R1 and the measured resistance of the resistor R2, and generates digital data corresponding to the difference value. The digital data is represented in an address of the look-up table 138, and the 8 bit control signal corresponding to the address designated by the digital data is provided to the first and second digital variable resistors 110 and 120.

Figure 6:
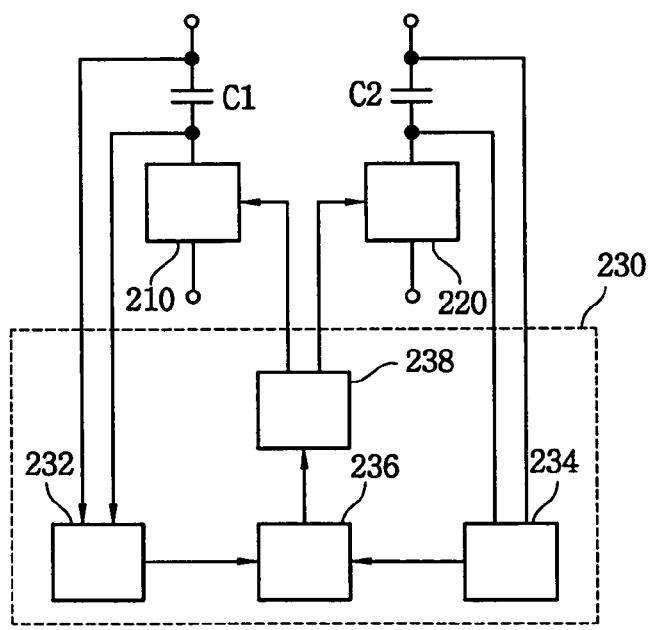
FIG. 6 is a block diagram showing a difference compensation circuit according to another exemplary embodiment of the present invention.
Figure 7:
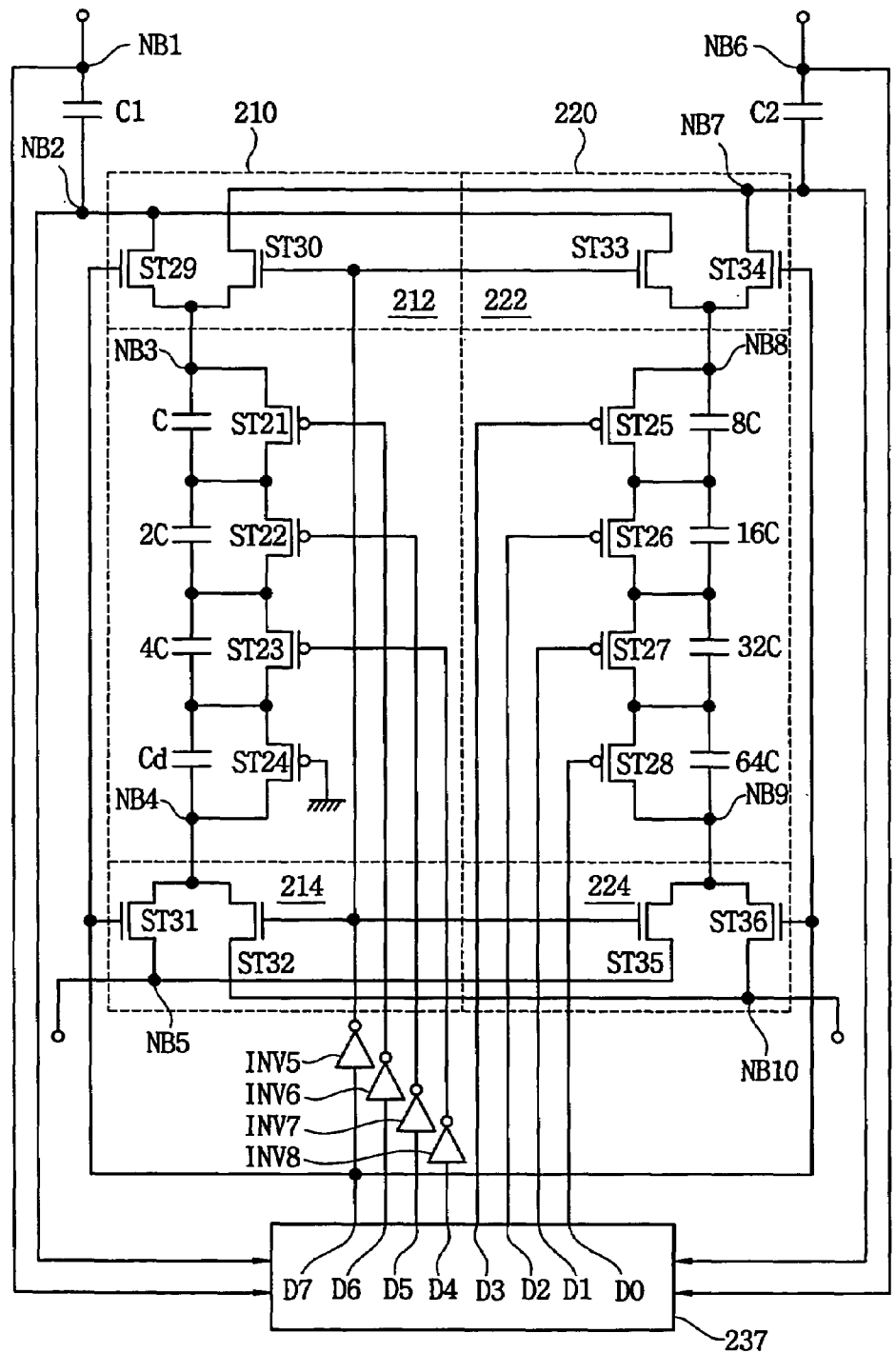
FIG. 7 is a circuit diagram showing digital variable impedance elements of FIG. 6.

FIG. 6 is a block diagram showing a difference compensation circuit 200 for compensating for the difference between impedance measured from balanced impedance elements according to another exemplary embodiment of the present invention. FIG. 7 is a circuit diagram showing digital variable impedance elements of FIG. 6. For exemplary purposes, the impedance measured from the balanced impedance elements of FIG. 6 and the digital variable impedance elements of FIG. 7, are hereinafter referred to and depicted as capacitance measured from balanced capacitive elements and digital variable capacitors, respectively. Referring to FIGS. 6 and 7, the difference compensation circuit 200 includes a first digital variable capacitor 210, a second digital variable capacitor 220 and a difference detection section 230.

The first digital variable capacitor 210 is connected in series to a capacitor C1, and the second digital variable capacitor 220 is connected in series to a capacitor C2. The difference detection section 230 is connected to the capacitors C1 and C2, calculates the capacitance difference between the capacitors C1 and C2, and provides the first and second digital variable capacitors 210 and 220 with an 8 bit control signal (D7, D6, . . . , D0) for compensating for the capacitance difference. The uppermost bit D7 of the 8 bit control signal is a sign bit. The sign bit is positive or negative according to the bit value '1' or '0'. The upper 3 bits (D6, D5, D4) are provided to the first digital variable capacitor 210, and the lower 4 bits (D3, D2, D1, D0) are provided to the second digital variable capacitor 220. The upper 4 bits (D7, D6, D5, D4) are inverted by inverters INV5, INV6, INV7 and INV8 before the upper 4 bits (D7, D6, D5, D4) are output from the difference detection section 230.

The first digital variable capacitor 210 includes four capacitors C, 2C, 4C and Cd each of which is connected in series to nodes NB3 and NB4. The capacitor C has a unit capacitance C, the capacitance of the capacitor 2C is two times as large as the unit capacitance C, and the capacitance of the capacitor 4C is four times as large as the unit capacitance C. The capacitor Cd is a dummy capacitor, and the capacitance of the dummy capacitor Cd is the same as an equivalent capacitance of capacitors 8C, 16C, 32C and 64C, which are coupled in series to one another in the second variable capacitor 220.

A switching element ST21 is connected in parallel to the capacitor C, a switching element ST22 is connected in parallel to the capacitor 2C, a switching element ST23 is connected in parallel to the capacitor 4C, and a switching element ST24 is connected in parallel to the capacitor Cd. The switching element ST24 is maintained in a turn-on state. The switching elements ST21, ST22 and ST23 are turned on in response to the inverted 3 bits $\overline{D6}$, $\overline{D5}$ and $\overline{D4}$, respectively. As shown in FIG. 7, when a PMOS transistor is used as the switching elements (e.g., ST21-ST24), a control electrode of the switching element ST24 is connected to a low power source (VSS), for example, an earth potential.

The second digital variable capacitor 220 includes the four capacitors 8C, 16C, 32C and 64C each of which is coupled in series to nodes NB8 and NB9. The capacitance of the capacitor 8C is eight times as large as the unit capacitance C, the capacitance of the capacitor 16C is sixteen times as large as the unit capacitance C, and the capacitance of the capacitor 64C is sixty four times as large as the unit capacitance C.

A switching element ST25 is connected in parallel to the capacitor 8C, a switching element ST26 is connected in parallel to the capacitor 16C, a switching element ST27 is connected in parallel to the capacitor 32C, and a switching element ST28 is connected in parallel to the capacitor 64C. The switching elements ST25, ST26, ST27 and ST28 are turned on in response to the lower 4 bits D3, D2, D1 and D0, respectively.

In particular, the output capacitance of the first digital variable capacitor 210 has 8 coarse levels (0, 1, . . . , 7) according to the value of the 3 inverted bits $\overline{D6}$, $\overline{D5}$ and $\overline{D4}$. The dummy capacitor Cd determines a difference between each of the coarse 8 levels. The output capacitance of the second digital variable capacitor 220 has 16 fine levels (0, 1, . . . , 15) according to the value of the 4 bits D3, D2, D1 and D0. The capacitor 64C determines the difference between each of the fine 16 levels.

Therefore, a total equivalent capacitance Cx between nodes NB1 and NB5 varies according to the coarse 8 levels. In the coarse 8 levels, the dummy capacitor Cd is a unit capacitance. A total equivalent capacitance Cy between a node NB6 and the node NB1 varies according to the fine 16 levels. In the fine 16 levels, the capacitor 64C is a unit capacitance.

For example, when the capacitors C1 and C2 are respectively 1 µF, and the capacitor C is 22.5 µF, the difference capacitance in the coarse 8 levels varies by about 11 µF, and the difference capacitance in the fine 16 levels varies by about 0.7 µF. Therefore, the total difference capacitance ΔC varies linearly according to 127 levels.

As shown in FIGS. 6 and 7, the first digital variable capacitor 210 includes switching circuits 212 and 214, and the second digital variable capacitor 220 includes switching circuits 222 and 224.

In the switching circuit 212, a switching element ST29 is connected between a node NB2 and the node NB3, and a switching element ST30 is connected between a node NB7 and the node NB8. The switching element ST29 is switched by the upper most bit D7, and the switching element ST30 is switched by the inverted upper most bit $\overline{D7}$. In the switching circuit 214, a switching element ST31 is connected between nodes NB4 and NB5, and a switching element ST32 is connected between the node NB4 and a node NB10. The switching element ST31 is switched by the upper most bit D7, and the switching element ST32 is switched by the inverted upper most bit $\overline{D7}$.

In the switching circuit 222, a switching element ST33 is connected between a node NB2 and the node NB8, and a switching element ST34 is connected between a is node NB7 and the node NB8. The switching element ST33 is switched by the inverted upper most bit $\overline{D7}$, and the switching element ST34 is switched by the upper most bit D7. In the switching circuit 224, a switching element ST35 is connected between the nodes NB9 and NB5, and a switching element ST36 is connected between the node NB9 and a node NB10. The switching element ST35 is switched by the inverted upper most bit $\overline{D7}$, and the switching element ST36 is switched by the upper most bit D7.

When the switching elements ST29, ST30, . . . , ST36 are PMOS transistors and D7 has a logic value of '0', the switching elements ST29, ST31, ST34 and ST36 are turned on and the switching elements ST30, ST32, ST33 and ST35 are turned off. Accordingly, the first digital variable capacitor 210 is connected to the nodes NB2 and NB5 via the switching elements ST29 and ST31, and the second digital variable capacitor 220 is connected to the nodes NB7 and NB10 via the switching elements ST34 and ST36.

When D7 has logic value of '1', the switching elements ST29, ST31, ST34 and ST36 are turned off and the switching elements ST30, ST32, ST33 and ST35 are turned on. Accordingly, the first digital variable capacitor 210 is connected to the nodes NB7 and NB10 via the switching elements ST30 and ST32, and the second digital variable capacitor 220 is connected to the nodes NB2 and NB5 via the switching elements ST33 and ST35.

According to the switching circuits 212, 214, 222 and 224, the first digital variable capacitor 210 is electrically connected in series to not only the capacitor C1 but also the capacitor C2, and the second digital variable capacitor 220 is electrically connected in series to not only the capacitor C2 but also the capacitor C1.

The total difference resistance Δc is regulated to vary from a −127 level to +127 level according to the 8 bit control signal (D0, D1, . . . , D7).

The difference detection section 230 includes first and second capacitance measuring sections 232 and 234, a difference obtaining section 236 and a look-up table 238. The first capacitance measuring section 232 measures the capacitance of the capacitor C1, and the second capacitance measuring section 234 measures the capacitance of the capacitor C2.

The measured capacitance is provided to the difference obtaining section 236. The difference obtaining section 236 obtains a difference value (or declination or variation) between the measured capacitance of the capacitor C1 and the measured capacitance of the capacitor C2, and generates digital data corresponding to the difference value. The digital data is represented in an address of the look-up table 238, and the 8 bit control signal corresponding to the address designated by the digital data is provided to the first and second digital variable capacitors 210 and 220.

Figure 8:
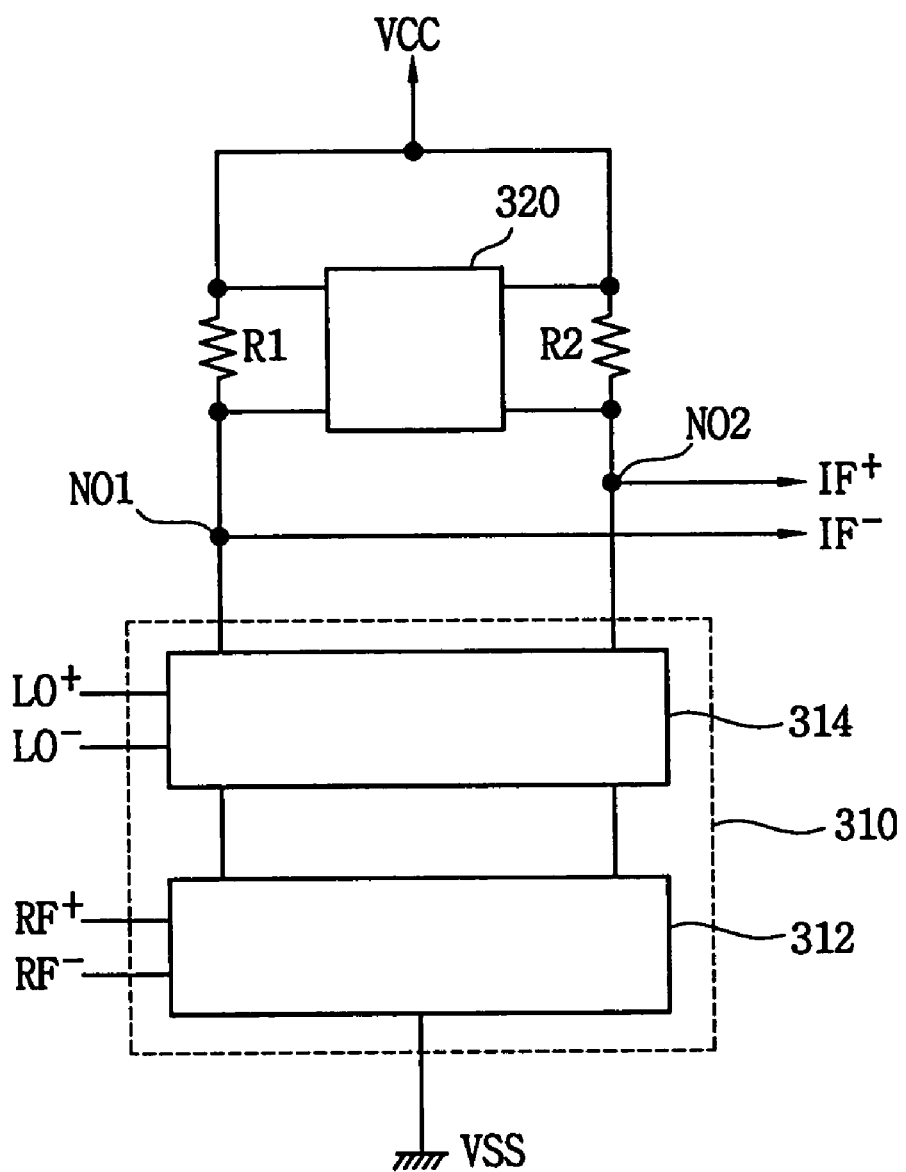
FIG. 8 is a block diagram showing a frequency mixer according to yet another exemplary embodiment of the present invention.
Figure 9:
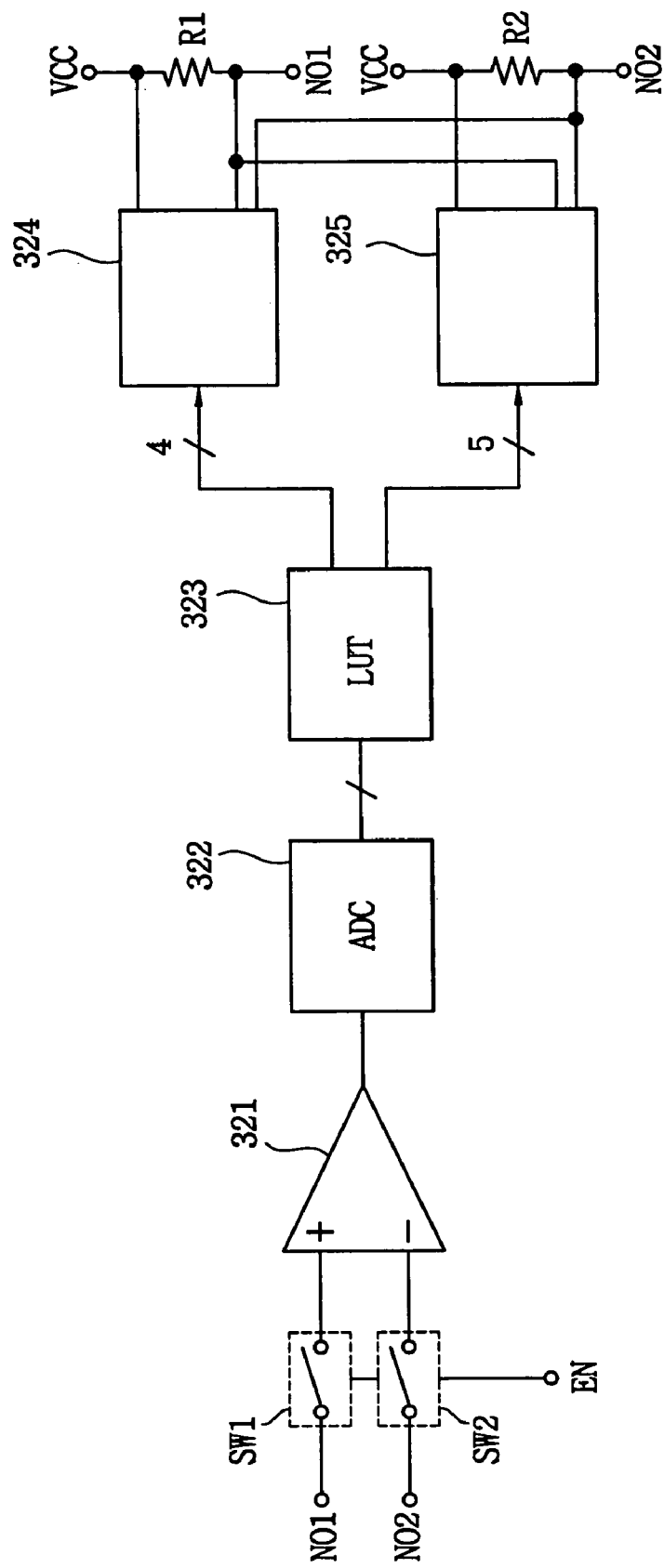
FIG. 9 is a block diagram showing a variant of a difference compensation circuit of FIG. 8.

FIG. 8 is a block diagram showing a frequency mixer 300 (or a circuit for mixing frequencies) according to yet another exemplary embodiment of the present invention. FIG. 9 is a block diagram showing a variant of a difference compensation circuit 320 of FIG. 8. Referring to FIGS. 8 and 9, the frequency mixer 300 includes a mixer circuit 310 and the difference compensation circuit 320. The mixer circuit 310 includes a differential input circuit 312 and a driving circuit 314.

The differential input circuit 312 receives two RF signals (RF+, RF−) through differential input terminals, respectively, and amplifies the two RF signals (RF+, RF−). The driving circuit 314 mixes the amplified RF signals with local oscillating signals (LO+, LO−) and outputs intermediate frequency (IF) signals (IF+, IF−) to output nodes NO1 and NO2. For example, the mixer circuit 310 includes an active balanced mixer such as a Gilbert mixer, folded cascade mixer, harmonic mixer and double balanced harmonic mixer, etc.

As shown in FIG. 8, a pull-up resistor R1 is connected between the output is node NO1 and a high power source VCC, and a pull-up resistor R2 is connected between the output node NO2 and the high power source VCC. The difference compensation circuit 320 is connected between the pull-up resistors R1 and R2 and, compensates for a declination of balanced resistive elements (e.g., the pull-up resistors R1 and R2). In other words, the difference compensation circuit 320 compensates for the difference between the resistance measured at the pull-up resistors R1 and R2, so that a direct current (DC) offset between the output nodes NO1 and NO2 is removed or reduced significantly.

Referring to FIG. 9, the difference compensation circuit 320 includes a comparator 321, an analog-to-digital converter (ADC) 322, a-look-up table (LUT) 323, a first digital variable resistor 324 and a second digital variable resistor 325. First and second switching elements SW1 and SW2 are connected to a non-inverting terminal (+) and an inverting terminal (−) of the comparator 321, respectively. The first and second switching elements SW1 and SW2 are switched in response to an enable signal (EN).

The comparator 321 detects a voltage difference between the output nodes NO1 and NO2 when the switching elements SW1 and SW2 are turned on. The ADC 322 converts the voltage difference into digital data. The digital data is represented in addresses of the look-up table 323. The look-up table 323 generates a control signal for compensating for the declination of balanced resistive elements (e.g., the pull-up resistors R1 and R2) in response to the digital data. The most significant bit (MSB) or sign bit, and 3 upper bits of the 8 bit control signal are provided to the first digital variable resistor 324, and the MSB and 4 lower bits of the 8 bit control signal are provided to the second digital variable resistor 325.

Therefore, the digital variable resistors 324 and 325 compensate for the declination of balanced resistive elements in response to the 8 bit control signal, so that the voltage difference between the output nodes NO1 and NO2 is maintained at zero when in a balanced condition of the mixer circuit 310.

When the compensation operation is completed, the switching elements SW1 and SW2 are turned off, and the resistance compensated by the digital variable resistors 324 and 325 are maintained. It is to be understood that the difference compensation circuit 320 compensates for not only the resistance difference between the pull-up resistors R1 and R2 but also for the DC offset of the mixer circuit 310.

Figure 10:
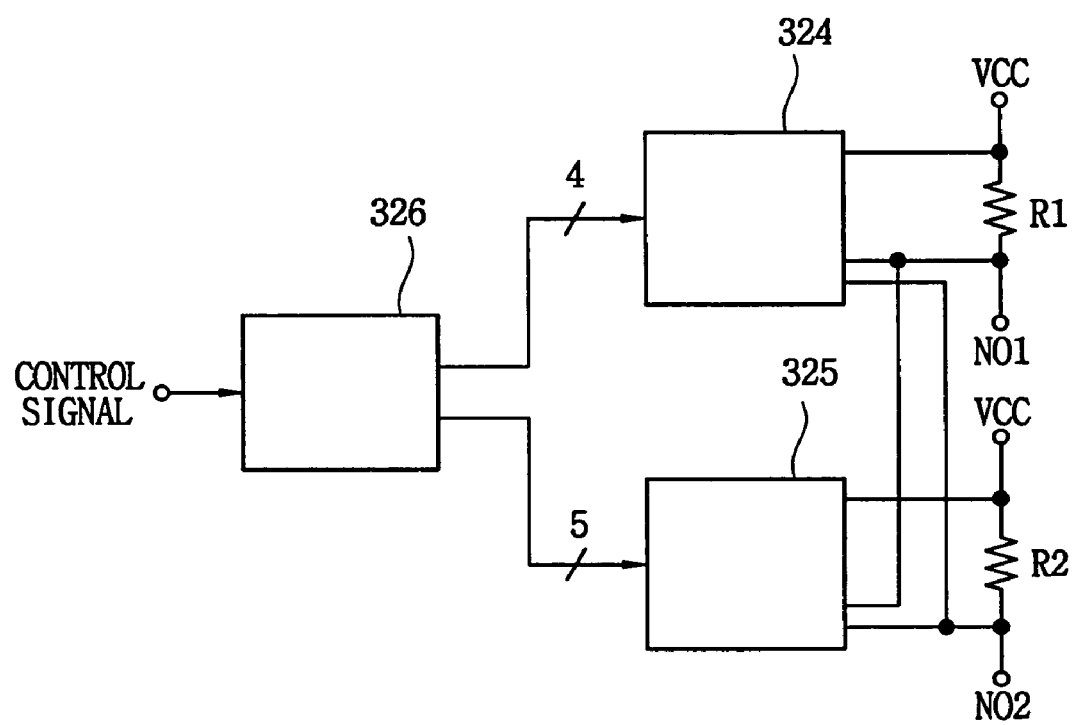
FIG. 10 is a block diagram showing another variant of the difference compensation circuit of FIG. 8.

FIG. 10 is a block diagram showing another variant of the difference compensation circuit 320 of FIG. 8. Referring to FIG. 10, a user, such as a system designer or hardware developer, measures the DC offset of the mixer circuit 310, and sets a control code value based on the measured result to compensate for the impedance difference. The difference compensation circuit 320 includes the first digital variable resistor 324, the second digital variable resistor 325 and a user interface 326, the analog-to-digital converter (ADC) 322 and the look-up table 323.

In an alternative variant of the present invention, a frequency mixer may be formed on a semiconductor substrate such as a silicon (Si) substrate, silicon-germanium (Si—Ge) substrate, gallium-arsenide (GaAs) substrate or an indium-phosphorous substrate using a bipolar junction transistor (BJT), metallic oxide semiconductor (MOS), complementary metallic oxide semiconductor (CMOS), a bipolar-CMOS (Bi-CMOS), heterojunction bipolar transistor (HBT), metal semiconductor field effect transistor (MES-FET) and high electron mobility transistor (HEMT) design technologies.

In yet another alternative variant of the present invention, the difference compensation circuit and frequency mixer may be incorporated into a portable communications device such as an RF transmitter-receiver of a mobile phone, a personal communications service (PCS) phone, a wireless local area network (LAN) transmitter-receiver, etc. Particularly, the difference compensation circuit and the frequency mixer may be incorporated in a DCR of a 900 Mhz mobile phone using a global system for mobile communication (GSM) technology and 1,800 Mhz or 1900 Mhz PCS phones.

In another alternative variant of the present invention, the difference compensation circuit may be incorporated in the active balanced mixer of the DCR. Therefore, IMD2 distortion due to the non-linear properties of the devices in the difference compensation circuit such as a mixer may be removed, the linearity of the circuit may be enhanced, and the receiver may effectively receive input signals.

While the present invention has been particularly shown and described with reference to exemplary embodiments thereof, it should be understood by those of ordinary skill in the art that various changes, substitutions and alterations can be made herein without departing from the scope of the invention as defined by appended claims and their equivalents.

What is claimed is:

1. A compensation circuit for compensating for a difference between impedance measured from first and second impedance elements, the compensation circuit comprising:
    a first impedance circuit for transforming a first impedance value into a fine impedance value having $2^n$ steps in response to n lower bits of a control signal having k bits, the first impedance value being measured at the first impedance element, k being equal to m plus n;
    a second impedance circuit for transforming a second impedance value into a coarse impedance value having $2^m$ steps in response to m upper bits of the control signal, the second impedance value being measured at the second impedance element;
    a first measuring section for measuring the impedance of the first impedance element and producing the first impedance value;

a second measuring section for measuring the impedance of the second impedance element and producing the second impedance value;

a difference obtaining section for taking a difference between the first impedance value and the second impedance value and generating a difference value; and a look-up table receiving the difference value as an address and producing the control signal having k bits.

2. The compensation circuit of claim 1, wherein the first and second impedance elements comprise resistive elements or capacitive elements.

3. The compensation circuit of claim 1, wherein each of the k bits of the control signal is determined such that the first impedance value is the same as the second impedance value.

4. A compensation circuit for compensating for a difference between resistance measured from first and second resistive elements, the compensation circuit comprising:

a first resistor for transforming a first resistance value into a fine resistance value having $2^n$ steps in response to n lower bits of a control signal having k bits, the first resistance value being measured at the first resistive element, wherein k is equal to m plus n, and m and n are positive integers;

a second resistor for transforming a second resistance value into a coarse resistance value having $2^m$ steps in response to m upper bits of the control signal, the second resistance value being measured at the second resistive element;

a first resistance measuring section for measuring the resistance of the first resistive element and producing the first resistance value;

a second resistance measuring section for measuring the resistance of the second resistance element and producing the second resistance value;

a difference obtaining section for taking a difference between the first resistance value and the second resistance value and generating a difference value; and a look-up table receiving the difference value as an address and producing the control signal having k bits.

5. The compensation circuit of claim 4, wherein the first resistor comprises:

n resistors having a $2^{(k-p)}$ ($n-m \leq p \leq n$) different resistance, wherein p is a positive integer; and n first switching elements being switched in response to a corresponding bit of said n lower bits of the control signal.

6. The compensation circuit of claim 5, wherein the second resistor comprises:

m resistors having a $2^{(k-q)}$($n+1 \leq q \leq m+n$) different resistance, wherein q is zero or a positive integer;

m second switching elements being switched in response to a corresponding bit of said m upper bits of the control signal; and a dummy resistor having a resistance substantially the same as an equivalent resistance of said n resistors.

7. The compensation circuit of claim 6, wherein the control signal further comprises a sign bit that represents a positive or negative value, and the first and second resistors further comprise a third switching element being switched in response to the sign bit so that the first resistor is coupled in parallel with the second resistive element and the second resistor is coupled in parallel with the first resistive element.

\* \* \* \* \*